United States Patent [19]
Bunker

[11] Patent Number: 5,834,787
[45] Date of Patent: Nov. 10, 1998

[54] DEVICE FOR MEASURING FLUX AND ACCUMULATED DOSE FOR AN ION BEAM CONTAINING A RADIOACTIVE ELEMENT

[76] Inventor: Stephen N. Bunker, 95 Audubon Rd., Wakefield, Mass. 01880

[21] Appl. No.: 887,509

[22] Filed: Jul. 2, 1997

[51] Int. Cl.$^6$ .................................................. H01J 37/244
[52] U.S. Cl. ..................................... 250/492.21; 250/347
[58] Field of Search ............................. 250/492.21, 397, 250/398, 392.2, 399, 400

[56] References Cited

U.S. PATENT DOCUMENTS

| | | | |
|---|---|---|---|
| 3,992,632 | 11/1976 | Kruger et al. | 250/423 R |
| 4,045,677 | 8/1977 | Humphries, Jr. et al. | 250/423 R |
| 4,124,802 | 11/1978 | Terasawa et al. | 250/492 A |
| 4,175,234 | 11/1979 | Hunt et al. | 250/427 |
| 4,321,467 | 3/1982 | Buttrill, Jr. | 250/288 |
| 4,465,524 | 8/1984 | Dearnaley et al. | 148/31.5 |
| 4,584,991 | 4/1986 | Tokita et al. | 128/1.1 |
| 4,586,490 | 5/1986 | Katz | 128/1.1 |
| 4,660,547 | 4/1987 | Kremer, Jr. | 128/1.1 |
| 4,714,074 | 12/1987 | Rey et al. | 128/1.1 |
| 4,715,359 | 12/1987 | Ryo | 128/1.1 |
| 4,803,977 | 2/1989 | Kremer, Jr. | 600/3 |
| 4,815,446 | 3/1989 | McIntosh | 600/3 |
| 4,831,270 | 5/1989 | Weisenberger | 250/492.2 |
| 4,869,835 | 9/1989 | Ogawa et al. | 250/423 R |
| 4,872,922 | 10/1989 | Bunker et al. | 148/4 |
| 4,881,937 | 11/1989 | van't Hooft et al. | 600/3 |
| 4,881,938 | 11/1989 | van't Hooft | 600/3 |
| 4,946,435 | 8/1990 | Suthanthiran et al. | 600/3 |
| 4,969,863 | 11/1990 | van't Hooft et al. | 600/3 |
| 5,030,194 | 7/1991 | van't Hooft | 600/3 |
| 5,047,648 | 9/1991 | Fishkin et al. | 250/397 |
| 5,059,166 | 10/1991 | Fishell et al. | 600/3 |
| 5,176,617 | 1/1993 | Fishell et al. | 600/3 |
| 5,393,986 | 2/1995 | Yoshinouchi et al. | 250/397 |
| 5,644,130 | 7/1997 | Raatz | 250/288 |

OTHER PUBLICATIONS

Tim A. Fishell, MD et al., "Low–Dose β–Particle Emission From 'Stent' Wire Results in Complete, Localized Inhibition of Smooth Muscle Cell Proliferation" in Circulation 90 pp. 2956–2963 (1994).

Armini, "Formation of New Surface Alloys by Ion Implantation Technology," Article produced by Implant Sciences Corporation, Danvers, Massachusetts 01923, (Jan., 1986).

Janicki et al., "Production and Quality Assessment of Beta Emitting P–32 Stents for applications in Coronary Angioplasty," Paper submitted to the $42^{nd}$ Annual Meeting of the Canadian College of Physicist in Medicine, Jun. 20–22, 1996, University of British Columbia, Vancouver, Canada.

(List continued on next page.)

*Primary Examiner*—Kiet T. Nguyen
*Attorney, Agent, or Firm*—Foley, Hoag & Eliot; Sayoko Blodgett-Ford; Donald W. Muirhead

[57] ABSTRACT

According to the present invention, an ion beam flux measurement device may include an exposure area, a measuring area disposed a predetermined distance from the exposure area, a moveable target having at least a portion thereof disposed within the exposure area, an actuator coupled to the target, and a radioactive emission detector disposed within the measuring area. The radioactive emission detector also may include a viewing portion and may detect beta rays or gamma rays. The actuator may include a feed roller and a take up roller. The target preferably may include a foil coupled to and extending between the rollers. The foil may be continuously moveable between the rollers or may be moveable in a stepwise manner. The ion beam flux measurement device also may include a collimator, preferably including a high density material when beta rays are to be detected, coupled to the radioactive emission detector. A secondary liner may be coupled to the collimator. At least a portion of the ion beam may be diverted to the exposure area and away from a normal path of the ion beam. The portion of the ion beam may be deflected with an electric charged particle deflector or a magnetic charged particle deflector.

32 Claims, 4 Drawing Sheets

OTHER PUBLICATIONS

Hessel et al, "Angiography and Vasa Vasorum Blood Flow after Aortic Dilation," *Investigative Radiology* (Sep.–Oct.) p. 404 (1978).

Goldberg et al, "In Vivo Aortic Smooth Muscle Cell (SMC) Kinetics: Responnse to Irradiation in the Rat," *Cell Tissue Kinet*, vol. 15, No. 6, p. 675 (1982).

Lee et al, "Effects of Laser Irradiation on Cardiac Valves Technique of Trans Catheter in Vivo Vaporization of Aortic Valve," *Laser Surg. Med.* vol. 3, No. 2, pp. 174–175 (1983).

Lee et al, "Laser Irradiation of Human Atherosclerotic Obstructive Disease: Simultaneous Visualization and Vaporization Achieved by a Dual Fiberoptic Catheter," *American Heart Journal*, vol. 105, No. 1, pp. 163–164 (1983).

Lee et al, "Effects of Laser Irradiation on Cardiac Valves Trans Catheter in Vivo Vaporization of Aortic Valve," *American Heart Journal*, vol. 107, p. 394 (Feb. 1984).

Solomon et al, "An In Vivo Method for the Evaluation of Catheter Thrombogenicity," *Journal of Biomedical Materials Research*, vol. 21, pp. 43–57 (1987).

Rosch et al, "Gianturco Expandable Wire Strents in the Treatment of superior Vena Cave Syndrome Recurring after Maximum Tolerance Radiation," *Cancer* (Phila), vol. 60, No. 6, pp. 1243–1246 (1987).

Daniel et al, "A New Rapid Safe Method for Local Radiation of Intrathoracic Sites," *Am. Surg.*, vol. 55, No. 9, pp. 560–562 (1989).

DEVICE FOR MEASURING FLUX AND ACCUMULATED DOSE FOR AN ION BEAM CONTAINING A RADIOACTIVE ELEMENT

FIELD OF THE INVENTION

This application relates to the field of ion beams and more particularly to the field of radioactive ion beam implanters.

BACKGROUND OF THE INVENTION

The use of ion beams for implanting radioactive atomic species into materials is uncommon because of the difficulty of minimizing human exposure to radioactivity and long term commitment of costly equipment.

U.S. Pat. No. 4,124,802 by Terasawa et al. (the '802 patent), for example, discloses a method of using ion implantation in connection with the disposal of waste from a nuclear reactor. The '802 patent describes a method of ionizing radioactive gas such as Kr-85, accelerating the ionized radioactive gas into a high energy form, then implanting the high energy radioactive gas in a base material such as a band-shaped stainless steel foil. A gas detector is employed in the '802 patent to determine the concentration of Krypton gas in the implantation unit and control the total amount of Krypton ions being implanted in the stainless steel foil. The ion implantation system of the '802 patent to Terasawa et al. for Krypton-85 is simple in its maintenance requirements for the ion source because unused radioactive feedstock gas can be almost completely removed from the ion implanter by the pumping/recovery system since it is an inert, non-condensible gas. Thus, the ion source retains essentially no radioactivity and any radioactivity that is present is not likely to be airborne during maintenance. However, the ion implantation system of the '802 patent is not optimal for a source that is not a gas at room temperature, such as phosphorous.

Moreover, since microcurie levels of radioactivity can be obtained even at very low ion doses on the order of $10^{10}$ radioactive ions/cm$^2$, abnormally low ion currents below $1\times10^{-9}$ amperes are often desirable. Such low currents are also beneficial for minimizing the total isotope burden within the ion implantation equipment, as well as for simplifying the radiation shielding considerations.

It is customary to use magnetic mass analysis to separate the desired atomic species from other spurious, usually non-radioactive species in the ion beam. For example, U.S. Pat. No. 4,831,270 by Weisenberger (the '270 patent), describes an ion source for implanting non-radioactive ions in semiconductor wafers. A conventional ion beam generator is used to generate an ion beam that initially travels horizontally and is then shaped by passing through a quadropole to impinge on a semiconductor wafer with the elongate dimension generally perpendicular to the wheel rotation. A deflector assembly may be used to divert the ion beam to a rotatable wafer wheel. The ion beam may be shifted using a magnet arrangement. The ion beam impinging on the wafers is measured by placing a sensor such as a Faraday cup behind a series of slots in the wafer wheel. Because the ion beam in the '270 patent is non-radioactive, no special features are disclosed for measuring and/or maximizing the flux of ions impacting the wafers when a radioactive ion beam is desired.

At the low current levels desirable for radioactive ion beams, it is common to observe a general background contamination from other unwanted species, some of which may coincidentally possess the same mass as that of the desired radioactive element and some of which may be the result of accidental leakage through the ion beam mass filtering system. Although all of these species are implanted into the sample, the delivered dose of useful radioactive ions may only be determined by direct measurement of their radioactive emissions.

Such a real-time direct measurement may be difficult when batch processing of many workpieces is employed because of 1) the overlap of many workpieces in the radiation detector's viewing window, 2) relative motion between the detector and workpieces, and 3) the variable sizes of production batches and components. In addition, such a measurement generally gives no useful data on the instantaneous radioactive component of the beam current, only the accumulated dose, so optimally aligning and maintaining the position of the radioactive ion beam relative to the workpieces may not be readily possible. Wastage of a radioactive ion beam due to misalignment is undesirably expensive because of the high cost of the radioactive materials used in the production of the ion beam. In addition, a poorly aligned ion beam may deposit radioactive materials at unwanted locations in the beam transport system, thus increasing the burden of accumulated radiation inside the equipment and making repair, servicing, and shielding costs significantly higher.

The common method of detecting an ion beam, collecting of all of its charge in a device called a Faraday cup as suggested in the '270 patent, assuming each ion possesses one unit of charge, and reading the resultant charge on an ammeter, is not optimal when the desired radioactive species is of a much smaller intensity than the non-radioactive contamination species. Normally, the magnetic field of the ion implanter's mass filter is adjusted until a maximum in the current from the Faraday cup is observed. The ammeter totals the charge from all species in the beam instead of just the desired radioactive species. However, the presence of leakage through the mass filter from stable isotopes of nearly similar mass is a common problem. As a typical example, stable isotope $p^{31}$ may be irradiated in a nuclear reactor to produce desirable radioactive isotope $p^{32}$. $p^{31}$ typically remains present in the activated sample at concentrations over $10^5$ times more abundant than $p^{32}$. The beam from the ion implanter mass filter will almost invariably contain far more $p^{31}$ than $p^{32}$ because of the leakage, and thus it may not be possible to reliably identify the $p^{32}$ beam in the background of $p^{31}$ on the basis of collected charge alone.

SUMMARY OF THE INVENTION

The present invention includes a method and an apparatus for measuring the instantaneous accelerated radioactive ion beam flux in an ion beam that contains both radioactive and non-radioactive species. The invention may be used for aligning the position of the radioactive ion beam for bombardment of workpieces, providing data for determining the total accumulated dose of radioactive atoms, measuring the instantaneous ion flux, and selecting the correct mass in an ion beam transport mass filter. The workpieces thus ion implanted may be used in many applications, such as surgical components with imbedded short half life radioactivity to inhibit regrowth of nearby tissue.

According to the present invention, an ion beam flux measurement device may include an exposure area, a measuring area disposed a predetermined distance from the exposure area, a moveable target having at least a portion thereof disposed within the exposure area, an actuator coupled to the target, and a radioactive emission detector disposed within the measuring area. The radioactive emission detector also may include a viewing portion.

The actuator may include a feed roller and a take up roller. The target preferably may include a foil coupled to and extending between the rollers. The foil may be continuously moveable between the rollers or may be moveable in a stepwise manner, so that instantaneous flux may be measured and, optionally, integrated electronically or using a computer to determine the total accumulated dose of radioactive ions based, in part, on the speed of the motion of the foil. The foil may include one or more materials selected from the group consisting of organic polymers, metallic coated organic polymers and metals. Metals may be useful to remove the accumulated charge on the foil and a pure metal foil may be employed where the power density of the ion flux is high enough to damage an organic polymer. Alternatively, a cooled surface may be thermally coupled to the foil to reduce the risk that a high power density in the ion beam will damage the foil. The speed of the foil may be selected based on the need for rapid measurement response time. A slow speed may be appropriate for consuming foil more slowly after the beam has been properly aligned. A fast speed may be useful for rapid information feedback to the operator of the equipment when setting the mass filter or the position of the ion beam.

The radioactive emission detector may detect beta rays or gamma rays. The ion beam flux measurement device may include a collimator, preferably including a high density material when beta rays are to be detected, coupled to the radioactive emission detector. A secondary liner may be coupled to the collimator.

A vacuum chamber having an interior portion, an exterior portion, and an opening also may be used. The foil may be disposed within the interior portion of the vacuum chamber and the radioactive emission detector may be disposed outside the exterior portion of the vacuum chamber. A window adapted to the opening may be disposed between the foil and the radioactive emission detector to provide a viewing path for the viewing portion of the radioactive emission detector. The window may include a thin membrane material, preferably an organic polymer. The window may be used to isolate the foil from atmosphere.

According further to the present invention, ion beam flux may be measured by exposing at least a portion of a target to an ion beam in an exposure area, moving the exposed portion of the target to a measuring area, measuring radioactive emissions from the exposed portion of the target, and removing the exposed portion of the target from the measuring area. A collimator may be used to restrict the cross-section of the measuring area. Portions of the target also may be moved substantially continuously, substantially cyclicly, or in a stepwise manner between the exposure area and the measuring area. The radioactive emissions from the target may be measured between a predetermined starting time and a predetermined stopping time. The ion beam may be pulsed incident on the target in the exposure area. The radioactive emissions accumulated between specific starting and stopping times may be measured to determine the cumulative radioactive ion flux. The measured radioactive emissions may be integrated to determine a total accumulated dose. The ion beam flux in the measuring area may be measured as a selected fraction of the total accelerated ion beam flux.

The radioactive emissions from the target may be measured from an ion beam that includes at least one radioactive atomic species and at least one non-radioactive atomic species.

At least a portion of the ion beam may be diverted to the exposure area and away from a normal path of the ion beam. The portion of the ion beam may be deflected with an electric charged particle deflector or a magnetic charged particle deflector.

DETAILED DESCRIPTION OF THE PREFERRED EMBODIMENT(S)

Ion beam flux and dose are routinely measured using the electric charge deposited in a charge collecting device called a Faraday cup. When a low current ion beam consists of a radioactive species intermixed with higher intensity fluxes of contamination by several stable isotopes, it may be difficult to continuously measure the dose of the radioactive isotope accumulated in the sample. For ion beam currents of less than 1 microampere, for example, the density of radioactive ions in the column of the ion beam inside the vacuum system of the ion implanter typically is very low and the rate of disintegration of these ions may be too small for an accurate measurement of instantaneous flux. A device is described herein to concentrate the activity to provide a real-time monitor for both flux and dose of the radioactive species.

If the radioactive ions in the ion beam can be accumulated in a restricted space for a short period of time, the resulting concentration of radioactive atoms may be sufficient to produce a reliably measurable flux of beta or gamma rays using any well known suitable detector for such rays, such as a Victoreen, Ludlum, Oxford Instruments, Bicron NE, or EG&G detector. Further, if the accumulation of radioactive atoms can be removed from the view of the beta or gamma ray detector and replaced repeatedly by a newly created accumulation of radioactive atoms, a real-time measurement of the instantaneous flux of radioactive ions may be achieved in a stepwise manner.

Moreover, the radioactive atoms may be made to impinge on a continuously moving thin foil so that unimplanted foil may constantly be introduced and implanted foil may constantly be removed from the view of the beta or gamma ray detector. The speed of the motion of the foil may then determine the response time and statistical accuracy for continuously measuring the instantaneous flux. The measured instantaneous flux may then be integrated using one of a variety of conventional electronic or computerized methods to determine the total accumulated dose. For example, a Victoreen detector may include this feature in its electronics or a circuit board may be used in connection with a software program.

Alternatively, an equivalent measurement may be provided if the incident flux is pulsed or in the form of a known fraction of the total instantaneous flux, with the fraction being a geometrical and/or a time fraction of the whole flux.

In some implementations, spurious background radioactive flux in a device for measurement of instantaneous flux may be minimized by locating the device in a position away from the normal path of the radioactive ion beam and utilizing a conventional electric or magnetic charged particle deflector to temporarily move the ion beam to impinge on the instantaneous flux measuring device.

Figure 1:
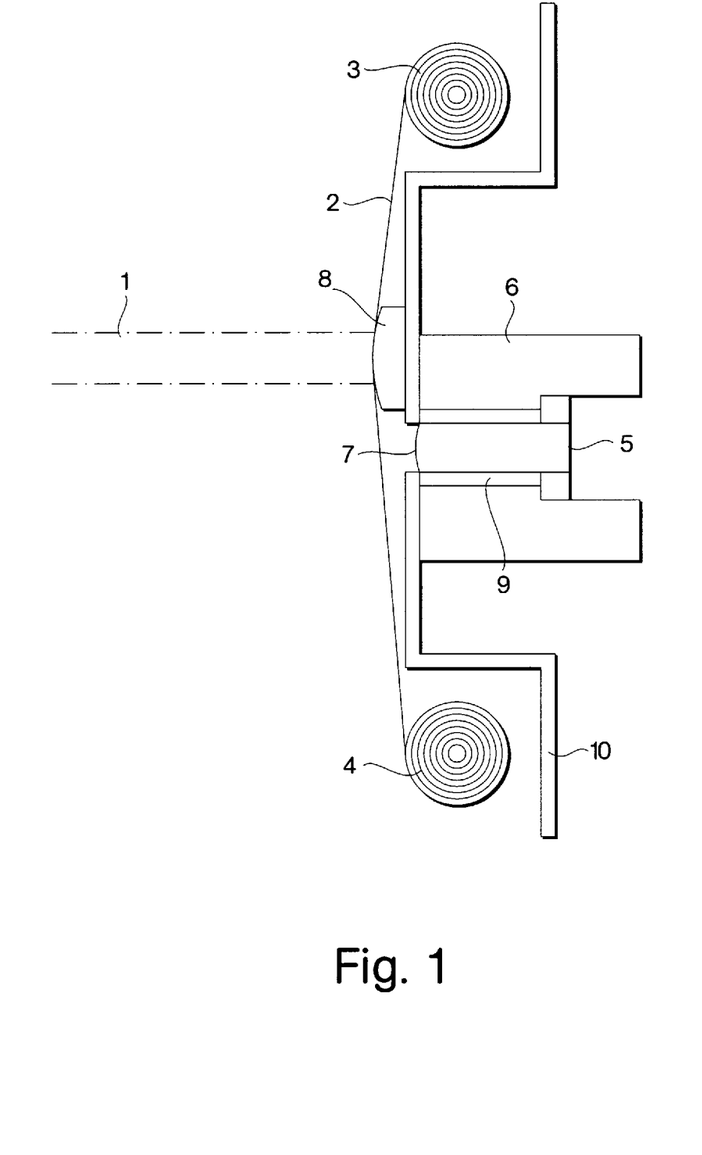
FIG. 1 is a schematic diagram illustrating a radioactive flux measuring device of the present invention.

FIG. 1 shows a schematic diagram of a device for measuring the instantaneous flux of an ion beam that contains one or more radioactive components as well as one or more non-radioactive components. The flux measurement device includes a moving foil 2 that intercepts an ion beam 1. The foil 2 may be unrolled from a feed roll 3 and removed onto a take-up roll 4. A detector 5, preferably for beta or gamma rays, may be located within a collimation device 6 such that the radiation emissions from the radioactive flux that has collected on the foil may be passed temporarily in front of a viewing zone. As the foil 2 moves, a continuous sample of the flux may be presented to the detector 5 for measurement of the accumulated radioactivity. A thin membrane window 7 may be used to isolate the foil 2, which preferably may be located inside a vacuum chamber 10, from atmosphere. A collimation device 6 may have a secondary liner 9, which optionally may be made of a low atomic number material when beta rays are to be detected. An optional cooled surface 8 may be employed if the power density of the ion beam 1 is high enough to damage the foil.

The counting rate of radiation seen by the detector 5 is proportional to the flux in the ion beam 1 according to well known geometrical and half life relationships.

While the actual constant of proportionality may differ for the geometry of specific implementations, a simplified form is given by $$I_{beam} = N_{cps} \times (2.51 \times 10^{-4}/\epsilon_{det} \times T_{1/2} \times R^2_{det}/A_{area} \times V_{foil}/L_{foil})$$
$$= N_{cps} \times (constant)$$

where:

$I_{beam}$=radioactive component of the instantaneous ion beam flux in nanoamperes $N_{cps}$=radioactive emissions per second measured by the beta and/or gamma ray detector $\epsilon_{det}$=efficiency of the beta and/or gamma ray detector for detecting radiation including corrections for losses in any thickness of material between the collected radioactive atoms and the detector $T_{1/2}$=half life in days of the radioactive isotope being measured by the detector $R_{det}$=distance between the foil and the detector in centimeters $A_{area}$=front surface area of the detector in square centimeters $V_{foil}$=speed in centimeters/second of the moving foil $L_{foil}$=length in centimeters of the foil viewed by the detector The instantaneous flux measurement device may collect all of the ion beam flux or a fractional portion of the flux. If a fractional portion of the flux is collected, the $N_{cps}$ must be divided by that fraction as a correction factor. Fractional beams may be employed when the full ion beam flux is intense enough to thermally damage the foil or overload the detector, when the workpiece is opaque to a significant fraction of the ion beam flux, or when a pulsed or scanned ion beam deflection mechanism is employed to momentarily divert the ion beam towards the instantaneous flux measurement device in order to sample the instantaneous ion beam flux.

The moving foil may be composed of an organic polymer, such as mylar, a metal coated organic polymer, such as aluminum coated mylar, or a thin metal foil, such as stainless steel or aluminum. The purpose of the metals is to remove the accumulated charge. A pure metal foil may be useful if the power density of the ion flux is high enough to damage an organic polymer. Alternatively, the foil may be passed over a smooth, actively cooled surface located in the region where the ion beam impinges on the foil in order to remove heat deposited by the ion beam.

The beta and/or gamma ray detector may be selected from any of a variety of types depending on the form of the radiation emitted by the radioisotope. For example, an isotope that is a pure beta ray emitter is most suitably detected with a device that has very low efficiency for gamma or x-radiation, such as a very thin silicon solid state detector.

The detector may be located external to the vacuum system of the ion implanter. A thin window made from an organic polymer may be used to provide a viewing path between the detector and implanted foil source, which is in the vacuum.

The speed of the foil may be selected based on the need for rapid measurement response time. A slow speed may be appropriate for consuming foil more slowly after the beam has been properly aligned. A fast speed may be useful for rapid information feedback to the operator of the equipment when setting the mass filter or the position of the ion beam. A fast speed typically yields a less precise measurement of the beam flux ($I_{beam}$) because the percent error of the measurement (1 Sigma) is given by $$100\%/\sqrt{N_{cps}}$$

and $N_{cps}$ is smaller for greater $V_{foil}$ and a fixed $I_{beam}$.

The instantaneous flux measurement device may be particularly advantageous for use when the ion beam contains a mixture of the desired radioactive species and other undesired species, which generally are not radioactive. The conventional method for measuring ion beam flux is to accumulate all of the charge deposited by the impinging ions and assume that each ion possesses one unit of charge. The standard device to accomplish this is a Faraday cup, and the resultant current of charge is read on an ammeter. The ammeter totals the charge from all of the species in the beam instead of just the desired radioactive species.

The following is a list, in order of intensity, of the possible species that may be found in a radioactive ion beam centered at mass 32: $P^{31+}$ (leakage from neighboring mass 31), $O_2^+$ (molecule, mass 32, 33), $P_2^{++}$ (molecule, doubly charged, effective mass 31, 31½, and 32), $PO_2^{++}$ (molecule, doubly charged, effective mass 31½ and 32), $P^{32+}$ (radioactive, $T_{1/2}$=14.28 days), $S^{32+}$ (non-radioactive decay product or contaminant, mass 32, 33), $Si^{32+}$ (radioactive, $T_{1/2}$=100 years), $Cu^{63++}$ (non-radioactive, doubly charged, effective mass 31½), $Cu^{65++}$ (non-radioactive, doubly charged, effective mass 32½), $Zn^{64++}$ (non-radioactive, doubly charged, effective mass 32), $Ni^{64++}$ (non-radioactive, doubly charged, effective mass 32). The desired radioactive component 2+ may be as much as 100 times less intense than $P^{31+}$ leakage, depending on the resolution of the mass filter.

In one possible implementation of the present invention, the detector may be composed of a plastic scintillator, 0.0008 inches thick with a beta efficiency of 65%. The collimator may be an annulus, 1" I.D.×3" O.D., made of machineable tungsten, with a length of 3 inches. The foil may be aluminized mylar, 0.001 inch thick. The foil speed may be 1 cm per second for beam alignment and setting of the mass filter, with the length of foil viewed being 1 inch along the foil. The count rate at a 1 cm/second fast foil speed may be 236±15 counts per second. The calculated $P^{32}$ ion flux at a fast foil speed of 1 cm/second may then be 4.6±0.3 nanoamperes. The total flux for all ions may be 0.5 microamperes. The count rate at a 0.2 cm/second slow foil speed may be 1180±34 counts per second. The calculated $p^{32}$ ion flux at a 0.2 cm/second slow foil speed may then be 4.5±0.1 nanoamperes.

Figure 2:
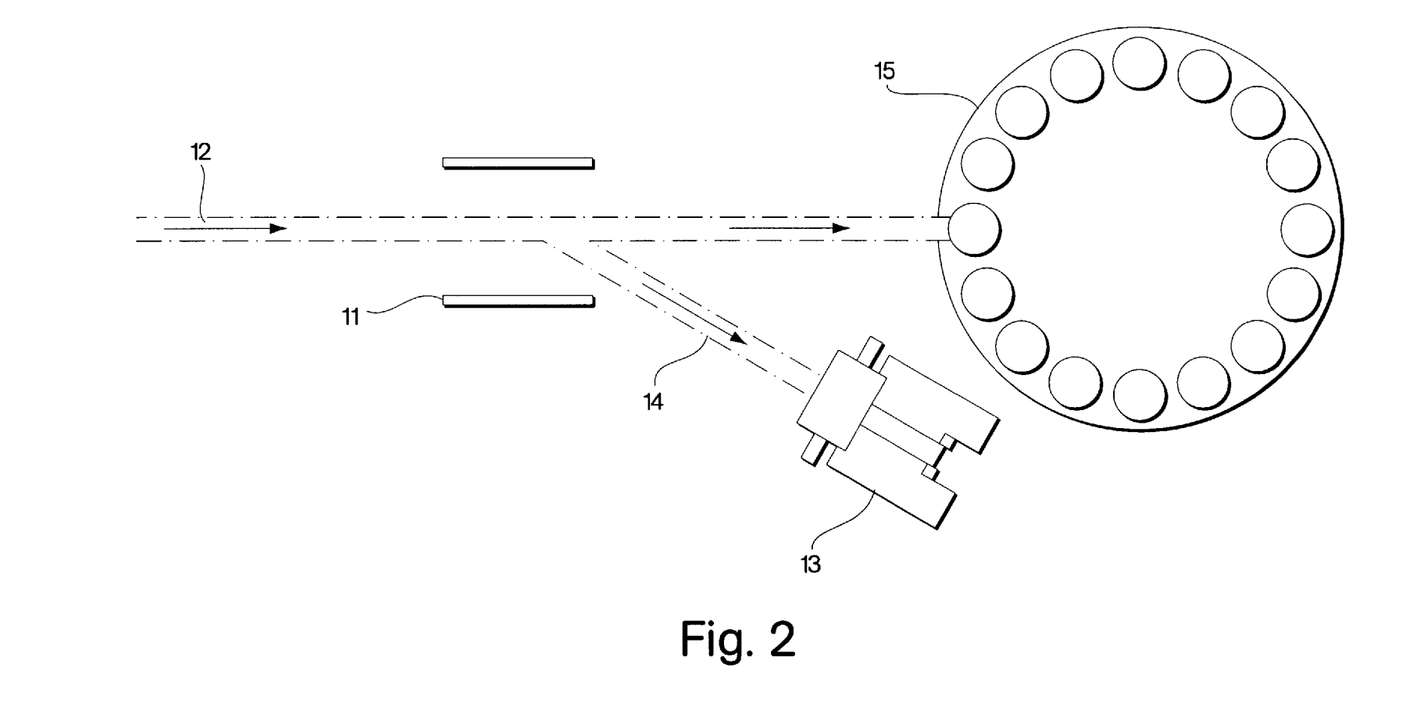
FIG. 2 is a schematic diagram illustrating the implementation of a radioactive flux measuring device with the ion beam momentarily diverted from its normal trajectory.

FIG. 2 shows an alternate implementation for use when the ion beam has an obstructed path through the workpiece (s) and it is not practical to locate the flux measuring device downstream of the workpieces. In this case all of the ion beam 12 that is located upstream of the workpieces 15, or a portion thereof, may be periodically diverted 14 towards the flux measuring device 13 by a deflector 11. The deflector 11 may employ either well known voltage deflection or magnetic deflection techniques. The deflection may be part of a commonly employed ion beam scanning system or it may be a pulsed device in which the deflection occurs for a short, fixed percentage of time on a repeating cycle. In this manner, brief samples of the radioactive ion beam flux may be measured without significant loss of flux from the workpieces.

Optionally, a device for mass selection of a low current radioactive ion beam may be used in connection with the present invention to maximize the radioactive ion beam being transmitted to the moving target. This arrangement may be desirable to reduce the risk that the foil will be damaged by a high intensity non-radioactive ion beam of a similar mass.

A mass filter for an ion implanter commonly employs a large magnet to disperse the monoenergetic ion beam from the ion source into a plurality of separated ion beams corresponding to each mass species contained within the original ion source beam. At the output end of the filter is commonly placed a mask with an aperture intended to block all of the plurality of beams with the exception of a single mass. The aperture may be of a fixed size or may be variable in size on one axis in order to permit modification of the mass resolution of the filter.

A typical ion implantation mass filter system causes a dispersion of the ion beams of the plurality of masses passing through the filter. This dispersion of ion beams can be made incident on and blocked by a mask with a single aperture at the downstream end of the mass filter system such that only a single mass may be transmitted through the aperture. Ion beams of neighboring masses within 5 AMU of the ion beam for the tuned mass may possess usefully measurable ion beam currents. Ion beams of neighboring masses of the tuned mass will impinge on the mask at predictable locations relative to the single aperture.

The ion beam current transmitted by a magnetic mass filter as a function of the tune of the filter is approximately a Gaussian function with the desired operating point usually being the maximum of the Gaussian. Significant ion beam current may be observed in the tail of the Gaussian, and the tail typically will overlap to some extent with the tune of the filter corresponding to a neighboring mass unit. The extent of the overlap is determined by the specific design of the magnetic mass filter, the tune of the ion source, voltage jitter from the acceleration power supply, current jitter in the magnet supply, and the ambient vacuum pressure. For radioactive feedstocks, the contamination current in the overlap often greatly exceeds the useful radioactive ion beam current, making the reproducible setting of the tune very difficult because the extent of the overlap will vary with many parameters, particularly the settings of the ion source.

The spatial separation of the magnetically dispersed radioactive beam and that of a non-radioactive neighbor that is within 5 AMU are fixed by the parameters of the magnetic mass filter, not the ion source or vacuum. While simple calculations may be employed to approximately determine the separation of two such beams impinging on a mask, it is presently more common to employ a computer program to precisely predict the trajectories of the beams. Therefore, when the ion beam current of a non-radioactive species is maximized at one specific location, one can be confident that the ion beam current of the useful radioactive species is maximized at a second known location. If two apertures at these locations are placed in the mask, which is typically found after the output of the magnetic mass filter, one aperture may be used to transmit the radioactive ion beam to the workpieces and the other can transmit beam to a current measuring device.

Figure 3:
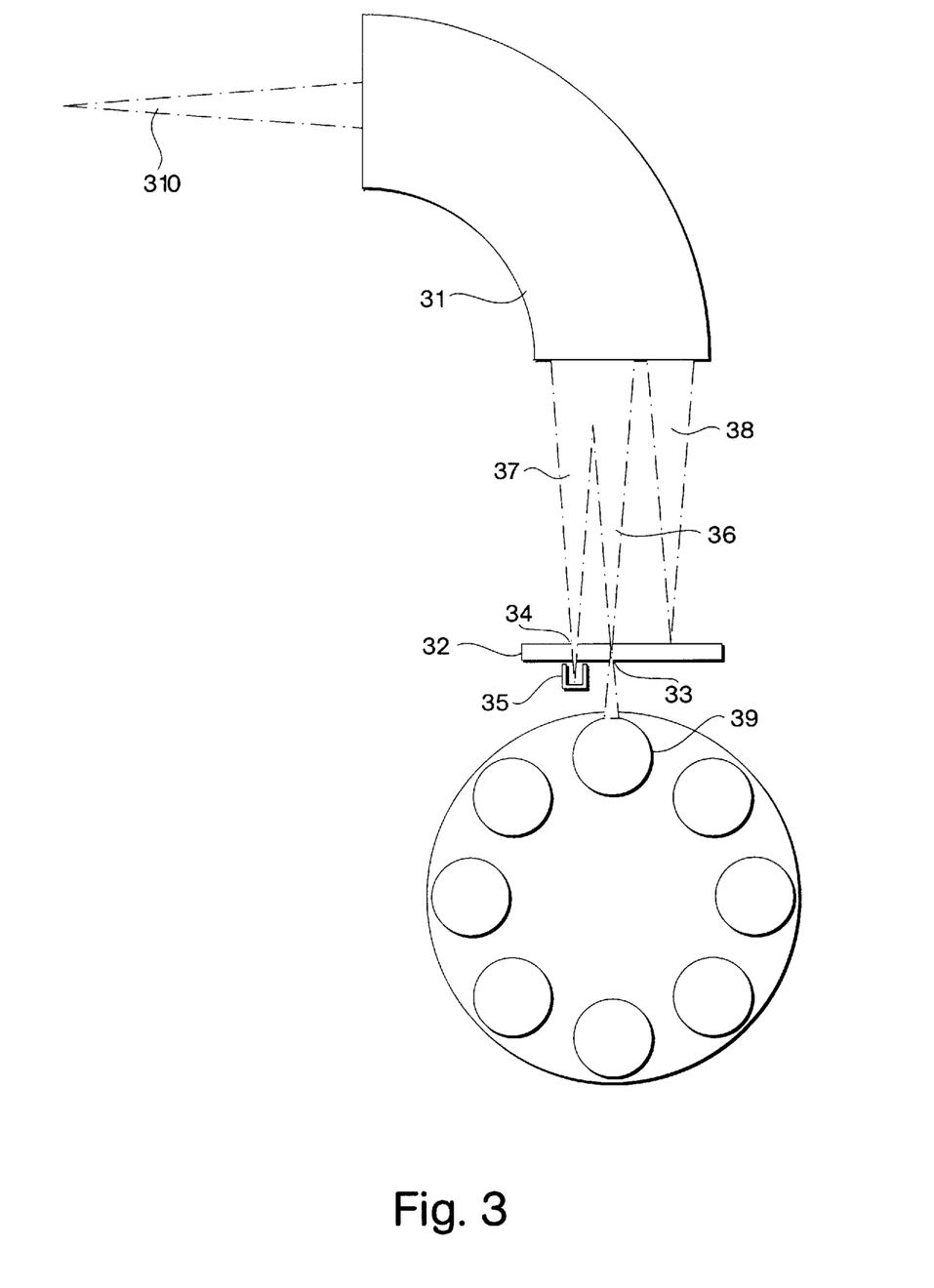
FIG. 3 illustrates an example of an ion beam mass selection device according to the systems and methods disclosed herein.

An example of an ion beam mass selection device is shown in FIG. 3. The embodiment shown in FIG. 3 utilizes a magnetic mass filter 31 with an ion beam 310 that includes at least one radioactive and one non-radioactive species being input into the magnetic mass filter 31. The output of the magnetic mass filter 31 includes the mass-dispersed beams 36, 37 and possibly others represented by 38. Two apertures 33, 34 may be located in the mask 32 following the output of the magnetic mass filter 31. A Faraday cup current measuring device 35 may be mounted on the mask 32 and may use one of the apertures 34 to receive the transmitted current of the non-radioactive ion beam 37. The radioactive ion beam 36 may be transmitted through the other aperture 33 towards the workpieces 39, which, optionally, may be repositioned, moved and/or rotated. Maximizing the measured current in the Faraday cup 35 may simultaneously maximize the transmitted radioactive ion beam current 36 if the separations of the apertures are selected according to the points of impingement of the ion beams 36, 37 on the mask 32.

In addition, the mask 32 may be modified so that the location of the non-radioactive beam transmission aperture 34 may be adjusted by small increments in order to control the spacing to more accurately match the actual points of impingement of the two ion beams 36, 37. Such an adjustable spacing may also be employed to select a different neighboring ion beam 38 instead of the originally selected non-radioactive ion beam 37 if the different neighboring ion beam 38 is more convenient because of intensity or spatial separation.

Figure 4:
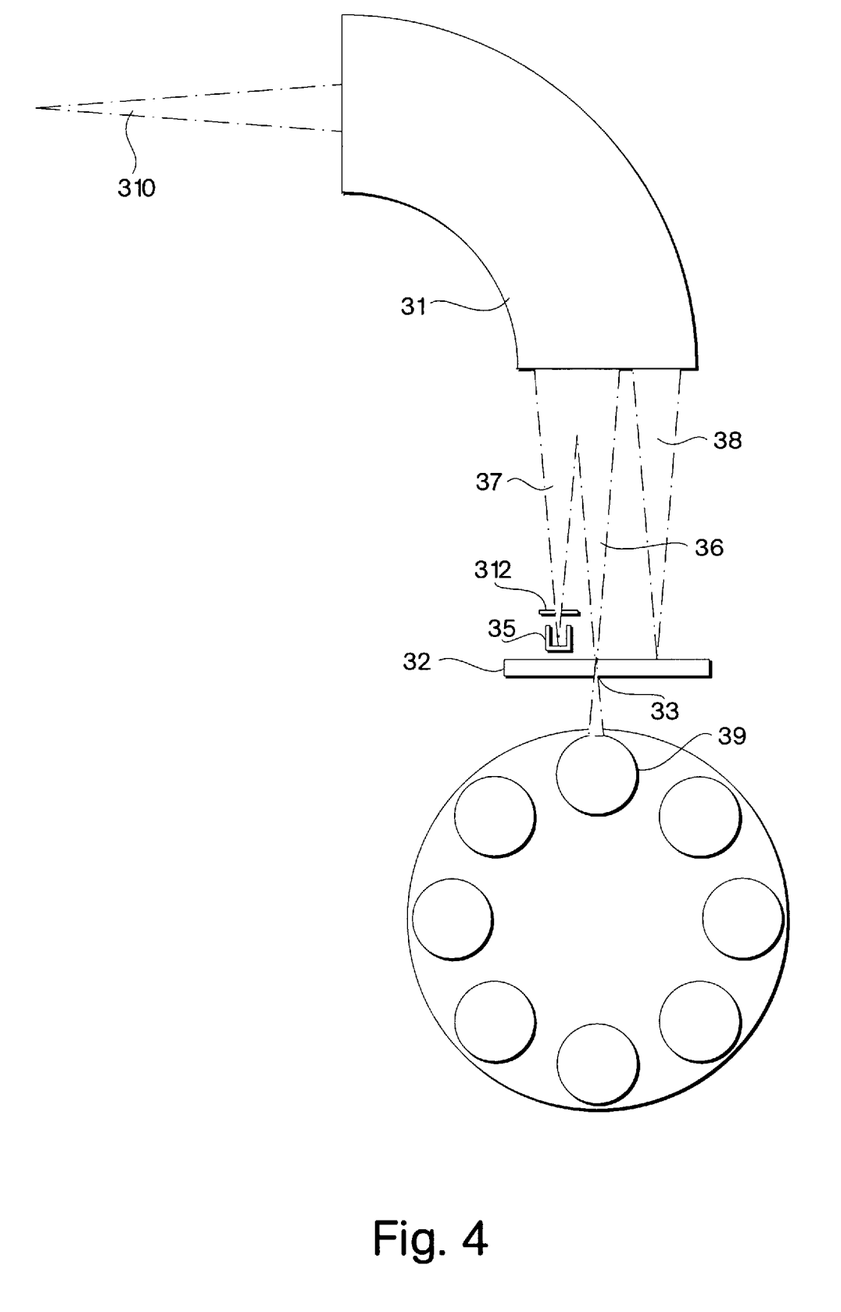
FIG. 4 illustrates an alternative embodiment of an ion beam mass selection device in which a Faraday cup is located between a mask and the output of a magnetic mass filter.

In an alternative embodiment shown in FIG. 4, the Faraday cup 35 may be located between the mask 32 and the output of the magnetic mass filter 31. A second aperture 312 may be mounted on and move with the Faraday cup 35. Optional translation of the Faraday cup 35 may be used to select one of several alternative non-radioactive ion beams and simultaneously maximize the current of the non-radioactive beam and the transmitted radioactive ion beam. The alternate embodiment of FIG. 4 may be preferred if space near the output of the non-radioactive ion beam transmission aperture 34 is restricted and cannot readily accommodate a Faraday cup or if a large range of spacings between dispersed beams must be accommodated.

The ion beam mass selection device may be tested and adjusted using the following procedure. Non-radioactive feedstock materials for the ion source may be installed and may correspond to the two neighboring masses producing the two ion beams 36, 37. For the example of $p^{31}$ and $p^{32}$, elemental phosphorus and sulfur hexafluoride may be used. Elemental phosphorus provides $p^{31}$ and $SF_6$ provides $S^{32}$. The ion implantation system and the magnetic mass filter may then be operated. The ion beam current transmitted to the workpieces 39 and the current in the Faraday cup 35 may be measured versus the tuning parameter of the magnetic mass filter 31, which is typically the current to the magnet but alternatively may be the magnetic field strength. It may be verified that both ion beam currents reach a maximum simultaneously. Optionally, the position of the non-radioactive ion beam transmission aperture 34 may have its position varied relative to the radioactive ion beam transmission aperture 33 so that both ion beam currents are maximized simultaneously. Alternatively, the position of the Faraday cup 35 may be translated so that both ion beam currents are maximized simultaneously.

While the invention has been disclosed in connection with the preferred embodiments shown and described in detail, various modifications and improvements thereon will become readily apparent to those skilled in the art. Accordingly, the spirit and scope of the present invention is to be limited only by the following claims.

I claim:

1. An ion beam flux measurement device, comprising:
    an exposure area;
    a measuring area disposed a predetermined distance from said exposure area;
    a moveable target having at least a portion thereof disposed within said exposure area;
    an actuator coupled to said target; and
    a radioactive emission detector disposed within said measuring area.

2. An ion beam flux measurement device, according to claim 1, wherein said actuator includes a feed roller and a take up roller.

3. An ion beam flux measurement device, according to claim 2, wherein said target includes a foil coupled to and extending between said rollers.

4. An ion beam flux measurement device, according to claim 3, wherein said radioactive emission detector has a viewing portion.

5. An ion beam flux measurement device, according to claim 3, wherein said foil is continuously moveable between said rollers.

6. An ion beam flux measurement device, according to claim 3, wherein said foil is moveable between said rollers in a stepwise manner.

7. An ion beam flux measurement device, according to claim 3, wherein said foil includes at least one material selected from the group consisting of organic polymers, metallic coated organic polymers and metals.

8. An ion beam flux measurement device, according to claim 3, further including a collimator coupled to said radioactive emission detector.

9. An ion beam flux measurement device, according to claim 8, further including a secondary liner coupled to said collimator.

10. An ion beam flux measurement device, according to claim 8, wherein said collimator includes a high density material.

11. An ion beam flux measurement device, according to claim 3, further including a vacuum chamber having an interior portion, an exterior portion, and an opening.

12. An ion beam flux measurement device, according to claim 11, further including a window adapted to said opening, wherein said foil is disposed within said interior portion of said vacuum chamber, said radioactive emission detector is disposed outside said exterior portion of said vacuum chamber, and said window is disposed between said foil and said radioactive emission detector.

13. An ion beam flux measurement device, according to claim 12, wherein said window includes a thin membrane material.

14. An ion beam flux measurement device, according to claim 16, wherein said thin membrane material includes an organic polymer.

15. An ion beam flux measurement device, according to claim 3, further including a cooled surface thermally coupled to said foil.

16. An ion beam flux measurement device, according to claim 3, wherein said radioactive emission detector detects gamma rays.

17. An ion beam flux measurement device, according to claim 3, wherein said radioactive emission detector detects beta rays.

18. An ion beam flux measurement device, comprising:
    target means for collecting ions from an ion beam in an exposure area;
    actuator means for moving said target means from the exposure area to a measurement area; and
    detecting means for detecting radioactive emissions from said target means within said measurement area.

19. A method of measuring ion beam flux, comprising the steps of:
    exposing at least a portion of a target to an ion beam in an exposure area;
    moving the exposed portion of the target to a measuring area;
    measuring radioactive emissions from the exposed portion of the target;
    and
    removing the exposed portion of the target from the measuring area.

20. A method of measuring ion beam flux, according to claim 19, further comprising the step of restricting the cross-section of the measuring area using a collimator.

21. A method of measuring ion beam flux, according to claim 19, further comprising the step of moving portions of the target substantially continuously between the exposure area and the measuring area.

22. A method of measuring ion beam flux, according to claim 19, further comprising the step of moving portions of the target substantially cyclicly between the exposure area and the measuring area.

23. A method of measuring ion beam flux, according to claim 19, further comprising the step of moving portions of the target in a stepwise manner between the exposure area and the measuring area.

24. A method of measuring ion beam flux, according to claim 19, further comprising the step of measuring the radioactive emissions from the target between a predetermined starting time and a predetermined stopping time.

25. A method of measuring ion beam flux, according to claim 19, further comprising the step of pulsing the ion beam incident on the target in the exposure area.

26. A method of measuring ion beam flux, according to claim 19, further comprising the step of measuring the radioactive emissions accumulated between specific starting and stopping times to determine the cumulative radioactive ion flux.

27. A method of measuring ion beam flux, according to claim 19, further comprising the step of integrating the measured radioactive emissions to determine a total accumulated dose.

28. A method of measuring ion beam flux, according to claim 19, further comprising the step of measuring the ion beam flux in the measuring area as a selected fraction of the total accelerated ion beam flux.

29. A method of measuring ion beam flux, according to claim 19, further comprising the step of measuring the radioactive emissions from the target from an ion beam that includes at least one radioactive atomic species and at least one non-radioactive atomic species.

30. A method of measuring ion beam flux, according to claim 19, further comprising the step of diverting at least a portion of the ion beam to the exposure area and away from a normal path of the ion beam.

31. A method of measuring ion beam flux, according to claim 30, further including the step of deflecting the portion of the ion beam with an electric charged particle deflector.

32. A method of measuring ion beam flux, according to claim 30, further including the step of deflecting the portion of the ion beam using a magnetic charged particle deflector.

* * * * *